(12) United States Patent
Cheng et al.

(10) Patent No.: US 10,319,638 B2
(45) Date of Patent: Jun. 11, 2019

(54) SELF-ALIGNED CONTACT CAP

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/879,035

(22) Filed: Jan. 24, 2018

(65) Prior Publication Data

US 2018/0166336 A1    Jun. 14, 2018

Related U.S. Application Data

(63) Continuation of application No. 15/216,154, filed on Jul. 21, 2016, now Pat. No. 9,929,046.

(51) Int. Cl.
*H01L 21/768* (2006.01)
*H01L 23/535* (2006.01)
*H01L 23/528* (2006.01)
*H01L 29/66* (2006.01)
*H01L 29/49* (2006.01)

(52) U.S. Cl.
CPC .. *H01L 21/76897* (2013.01); *H01L 21/76804* (2013.01); *H01L 21/76805* (2013.01); *H01L 21/76895* (2013.01); *H01L 23/5283* (2013.01); *H01L 23/535* (2013.01); *H01L 29/4991* (2013.01); *H01L 29/66545* (2013.01)

(58) Field of Classification Search
CPC ........... H01L 21/76897; H01L 23/5283; H01L 29/4991
See application file for complete search history.

(56) References Cited

U.S. PATENT DOCUMENTS 5,970,370 A    10/1999  Besser et al.
6,214,713 B1    4/2001  Shiao
(Continued)

FOREIGN PATENT DOCUMENTS

KR    2001-0003423 A    1/2001
KR    10-2005-0024977 A    3/2005
KR    10-2016-0021902 A    2/2016

OTHER PUBLICATIONS

Office Action for U.S. Appl. No. 15/685,776 dated Jul. 27, 2018.
List of IBM Patents or Patent Applications Treated as Related dated Jan. 24, 2018, 2 pages.

*Primary Examiner* — Kenneth Parker
*Assistant Examiner* — Long H Le
(74) *Attorney, Agent, or Firm* — Tutunjian & Bitetto, P.C.; Vazken Alexanian

(57) ABSTRACT

A method for forming a semiconductor device includes recessing a gate conductor in a gate structure to form a first divot, forming a gate cap in the first divot and recessing a dielectric fill that encapsulates the gate structures to a position below a top of the gate cap. An extension layer is deposited over the dielectric fill and the top of the gate cap and is planarized to the top of the gate cap. The extension layer is expanded to form a profile growth layer that is thicker than the extension layer and creates a second divot over the gate cap. A top cap is formed in the second divot to provide a cap with a thickness of the gate cap and the top cap.

11 Claims, 6 Drawing Sheets

(56) References Cited

U.S. PATENT DOCUMENTS

| | | | |
|---|---|---|---|
| 6,346,467 B1 | 2/2002 | Chang et al. | |
| 6,580,137 B2 | 6/2003 | Parke | |
| 7,875,519 B2 | 1/2011 | Rachmady et al. | |
| 7,977,181 B2 | 7/2011 | Lai et al. | |
| 8,294,223 B2 | 10/2012 | Rachmady et al. | |
| 8,569,165 B2 | 10/2013 | Gordon et al. | |
| 9,263,540 B1 | 2/2016 | Lin et al. | |
| 2008/0076216 A1 | 3/2008 | Pae et al. | |
| 2009/0321934 A1 | 12/2009 | Lavoie et al. | |
| 2010/0087055 A1 | 4/2010 | Lai et al. | |
| 2013/0256899 A1 | 10/2013 | Boyanov et al. | |
| 2015/0021683 A1* | 1/2015 | Xie | H01L 29/6653 257/330 |
| 2015/0076609 A1 | 3/2015 | Xie et al. | |
| 2015/0228585 A1 | 8/2015 | He et al. | |
| 2015/0270224 A1 | 9/2015 | Boyanov et al. | |
| 2015/0364378 A1* | 12/2015 | Xie | H01L 21/82343 257/368 |
| 2016/0043197 A1* | 2/2016 | Kim | H01L 21/31116 438/283 |
| 2017/0047253 A1* | 2/2017 | Park | H01L 21/76897 |
| 2017/0186682 A1 | 6/2017 | Anderson et al. | |
| 2017/0207122 A1* | 7/2017 | Park | H01L 21/76897 |
| 2017/0213829 A1 | 7/2017 | Xiao | |
| 2017/0222018 A1 | 8/2017 | Zhang | |
| 2017/0345912 A1* | 11/2017 | Kim | H01L 21/28088 |

\* cited by examiner

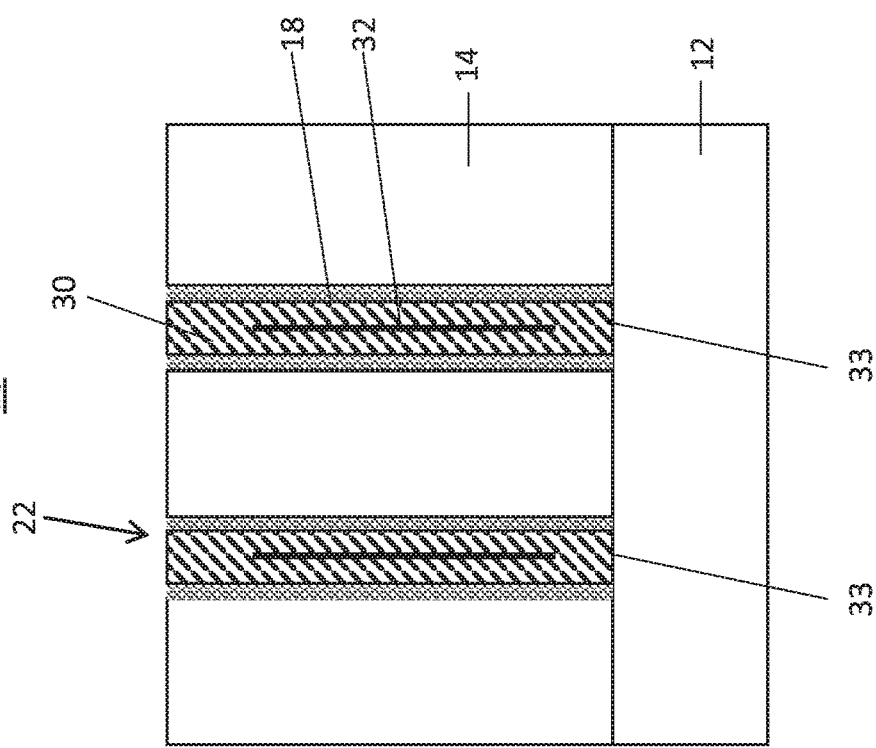
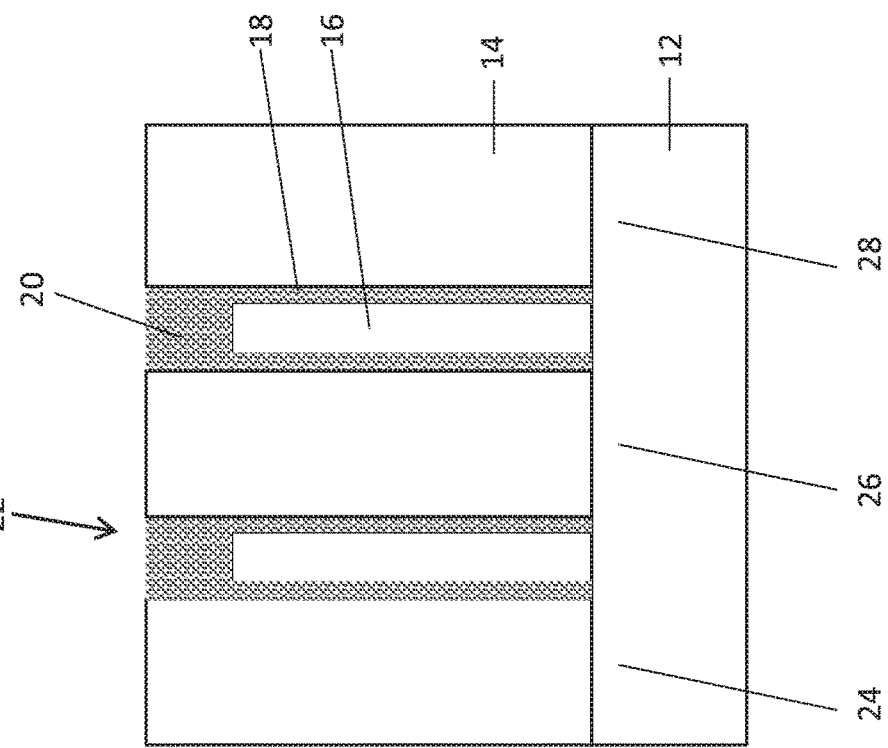

SELF-ALIGNED CONTACT CAP

BACKGROUND

Technical Field

The present invention generally relates to semiconductor processing, and more particularly to devices and methods for forming self-aligned contact caps with minimum recessing to avoid interacting with seams formed within the contacts.

Description of the Related Art

Contacts are often formed within a trench structure having a high aspect ratio. In some instances, contacts are formed over gate conductors. A sufficient thickness of dielectric material needs to be maintained over the gate conductors to ensure that the contacts and the gate conductors do not short out. Dielectric caps are often formed over the gate conductors to prevent this shorting. However, due to contact hole etching, the caps are eroded away causing shorting concerns.

Forming gate conductors often results in a metal fill material that develops seams within the material. These seams often form toward a bottom of a trench structure due to process limitations (e.g., pinch-off). Seams may include elongated voids or lines within the material. Open seams can create potential risks for device failure.

SUMMARY

In accordance with an embodiment of the present principles, a method for forming a semiconductor device includes recessing a gate conductor in a gate structure to form a first divot, forming a gate cap in the first divot and recessing a dielectric fill that encapsulates the gate structures to a position below a top of the gate cap. An extension layer is deposited over the dielectric fill and the top of the gate cap and is planarized to the top of the gate cap. The extension layer is expanded to form a profile growth layer that is thicker than the extension layer and creates a second divot over the gate cap. A top cap is formed in the second divot to provide a cap with a thickness of the gate cap and the top cap.

Another method for forming a semiconductor device includes forming a dummy gate; forming spacers on sidewalls of the dummy gate to form gate structures; filling between the gate structures with a dielectric fill; replacing the dummy gate with a replacement gate having a gate conductor formed by deposition; recessing the gate conductor in the gate structure to form a first divot that is shallow enough not to interfere with a potential seam formed during gate conductor formation; forming a gate cap in the first divot; recessing a dielectric fill that encapsulates the gate structures to a position below a top of the gate cap; depositing an extension layer over the dielectric fill and the top of the gate cap; planarizing the extension layer to the top of the gate cap; expanding the extension layer to form a profile growth layer that is thicker than the extension layer and creates a second divot over the gate cap; and forming a top cap in the second divot to provide a cap with a thickness of the gate cap and the top cap.

A semiconductor device includes a gate conductor formed in a gate structure and a gate cap formed on the gate conductor. A dielectric fill encapsulates the gate structure to a position below a top of the gate cap. A profile growth layer creates a divot over the gate cap. A top cap is formed in the divot to provide a cap with a thickness of the gate cap and the top cap.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view showing a partially fabricated semiconductor device having dummy gates formed with spacers to provide gate structures on a fin or substrate in accordance with the present principles;

FIG. 2 is a cross-sectional view showing the semiconductor device of FIG. 1 having the dummy gates pulled and replaced with gate conductors in accordance with the present principles, the gate conductors potentially forming seams therein;

DETAILED DESCRIPTION

Figure 3:
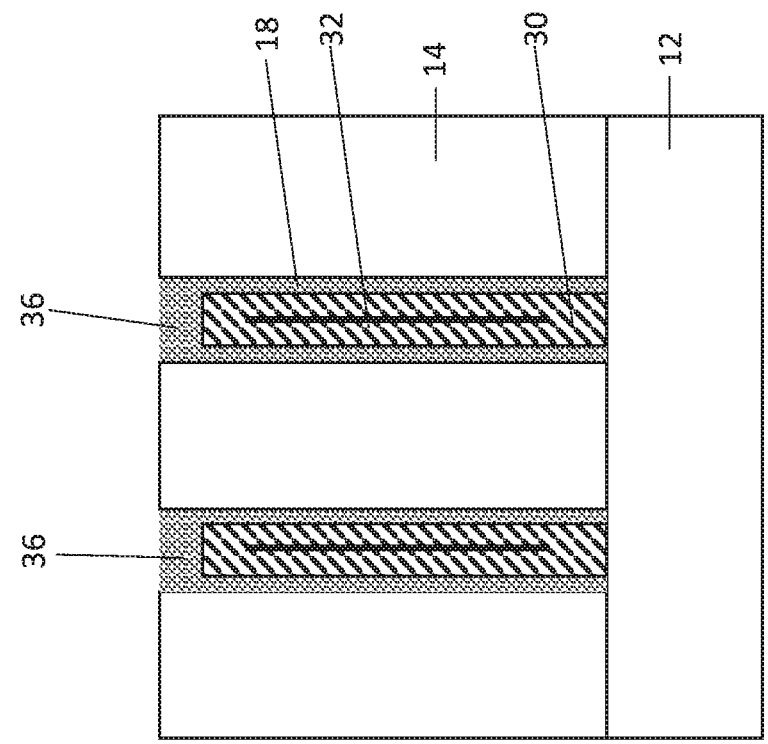
FIG. 3 is a cross-sectional view showing the semiconductor device of FIG. 2 having the gate conductors shallowly recessed to prevent interaction with the seams and to form a divot in accordance with the present principles.

In accordance with the present principles, devices and methods are provided that form thicker caps for gate structures so that when self-aligned contacts (SAC) are formed, more process tolerance is provided. The thicker caps permit minimum conductor recessing to avoid coming into contact with material seams that form within the conductor material. In useful embodiments, a metal formed in a trench is recessed a small amount to avoid uncovering a seam. Then, a surrounding material (e.g., a dielectric layer) may be built up to maintain the height of the metal and provide greater depth for cap formation. This prevents the recess from entering too deeply into the metal to potentially or actually expose a seam within the metal.

In a particularly useful embodiment, the surrounding material includes polysilicon deposited over the metal (e.g., gate conductor). The polysilicon is then oxidized to expand the material and form a dielectric layer that provides additional thickness over the metal (contacts). Then, the additional thickness may be employed to provide a thicker gate cap. After the oxidation is performed to expand the material to form a cavity on top of gate, an isotropic trim/etch process may be performed to adjust the cavity to make sure a width of the cavity equal or larger than the gate dimension.

The present principles may be applied to any device or component. In useful embodiments, the present principles may be employed for gates and contacts of field effect transistors (FETs). The FETs may include finFETs, planar devices, nanowires, vertical devices, etc.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use operation in addition to the orientation depicted in the FIGS. For example, if the device in the FIGS. is turned over, elements described as "below" or "beneath" other elements or feat would then be oriented "above" the other elements or features. Thus, the term "below" can encompass both an orientation of above and below. The device may be otherwise oriented a 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated semiconductor device 10 is illustratively shown. The device 10 includes a semiconductor substrate 12 that may include a bulk-semiconductor substrate, a semiconductor-on-insulator (SOI) substrate or any other suitable substrate for forming electronic devices. In one example, the bulk-semiconductor substrate 12 may be a silicon-based material. Illustrative examples of Si-based materials suitable for the bulk-semiconductor substrate 12 include, but are not limited to, Si, SiGe, SiGeC, SiC, etc. and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc sellenide, etc. Although not depicted in FIG. 1, the semiconductor substrate 12 may also be a semiconductor on insulator (SOI) substrate.

Fins may be etched into the substrate 12 by employing a lithographic patterning process, a spacer image transfer process, (e.g., self-aligned quadruple patterning (SAQP) or a self-aligned double patterning (SADP)), etc. to form an etch mask and then etch the substrate 12 using, e.g., a reactive ion etch (RIE) process. The fins are etched to a desired depth. In FIG. 1, the fins extend in a perpendicular orientation to gate structures 22.

A dielectric layer may deposited over the fins and recessed by a recess etch process to form shallow trench isolation regions (not shown). The dielectric layer 16 may include an oxide, although other suitable dielectric materials may be employed.

Gate formation is performed to provide gate structures 22. The gate formation process may include a gate first process or a replacement gate or gate last process. In a gate first process, gate materials are formed and patterned that will be employed as the actual gate. In a gate last process, a dummy gate 16 is formed and then later removed and replaced by permanent gate materials. Dummy gate 16 is deposited and patterned using lithography, SADP, etc. and etching (e.g., reactive ion etching (RIE)). A hardmask 20 may be deposited on the dummy gate 16 and patterned along with the dummy gate 16. The hardmask 20 may include a suitable dielectric material, such as, e.g., silicon nitride or silicon oxynitride. The dummy gate 16 may include polysilicon or amorphous silicon if a dummy gate is employed for a gate last/replacement gate structure.

A spacer layer is conformally deposited over all surfaces of the device 10. The conformal layer may include a thin coating having a thickness of between about 2 nm to about 10 nm. The conformal layer may be deposited using a chemical vapor deposition (CVD) process, an atomic layer deposition (ALD) process or any other suitable conformal deposition process. The spacer layer is etched (e.g., RIE) in a spacer etch back process to remove horizontal portions and form spacers 18. Spacers 18 may include a nitride material, e.g., a silicon nitride.

Exposed portions 24, 26, 28 of the fins (12) between gate structures 22 are prepared for the formation of source/drain (S/D) regions. S/D regions are grown on the fins by an epitaxial deposition process. The epitaxial deposition process can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process.

A dielectric fill 14 is applied to the device 10. The dielectric fill 14 fills in between gate structures 22 and covers the fins (12). The dielectric fill 14 may include an oxide, such as a silicon oxide or may include polysilicon. Other materials may also be employed. A planarization process, e.g., CMP is performed. The planarization process removes dielectric fill 14 from a top surface and stops on the hardmask 20.

Referring to FIG. 2, the hardmask 20 is removed to expose the dummy gate 16. This may be performed using a selective etch process that removes the hardmask 20 relative to the dielectric fill 14. Then, the dummy gate 16 is pulled out by a selective etch process which removes the dummy gate 16 (e.g., polysilicon or amorphous silicon) relative to the spacers 18, fin or substrate 12 and the dielectric fill 14. A gate dielectric 33 is formed on the fin or substrate 12. The gate dielectric may include a grown oxide or may include a high-k material, e.g., HfO$_2$, etc. or combinations thereof.

A conductive material is deposited in the gate structures 22 to form a gate conductor 30. The conductive material may include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials.

In one particularly useful, embodiment, the gate conductor 30 includes tungsten. After the conductive material fill, a planarization process, e.g., CMP, is performed to remove excess material from a top surface. The conductive material fill may include seams 32 that form between portions of the conductive material layer during deposition as a result of the narrow size of the gate structure 22. The pinching off of the material gradually reduces the seam 32 at the top of the gate conductor 30.

Referring to FIG. 3, a top portion of the gate conductor 30 is exposed. A recess etch is performed to create a divot 34. The recess etch may include a selective wet or dry etch and, in particular, RIE. The divot 34 is recessed to a height position greater than the seam 32. The location of seams 32 is fairly reproducible knowing the aspect ratio of the trenches where the gate conductor 30 is formed. The recess etch may be timed to avoid interaction with the seam 32 and permit sufficient space for the formation of a self-aligned contact (SAC) cap that will be formed in the divot 34.

Figure 4:
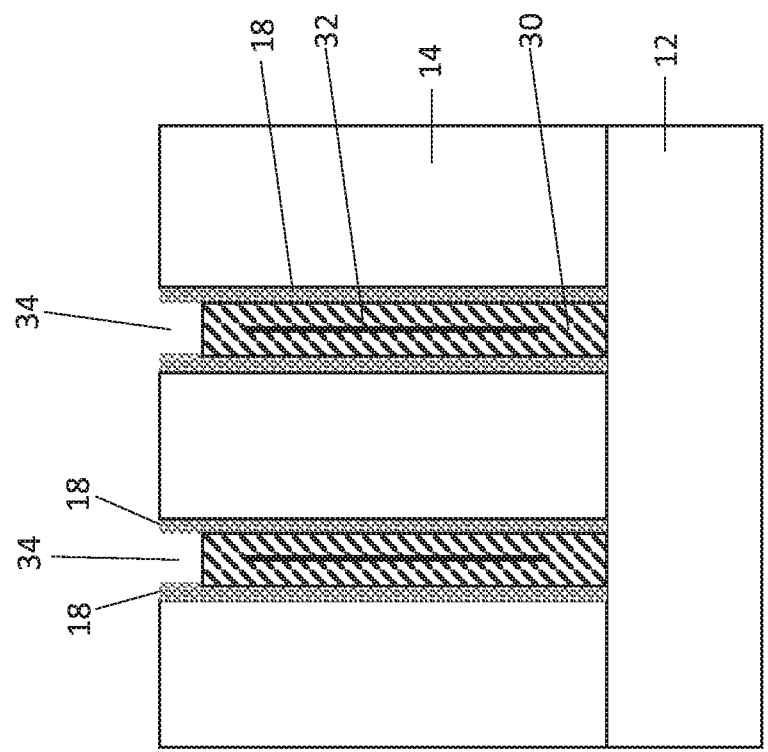
FIG. 4 is a cross-sectional view showing the semiconductor device of FIG. 3 having a gate cap formed in the divot over the gate conductors in accordance with the present principles.

Referring to FIG. 4, a gate cap 36 is formed on the gate conductor 30. The gate cap 36 may include a nitride, such as SiN or other dielectric materials, e.g., an oxide, an oxynitride, etc. In one embodiment, the gate cap 36 is formed by depositing dielectric material to fill in the divots 34 (FIG. 3) and then a top surface of the device 10 is planarized, e.g., by CMP or an etch, to confine the gate cap 36 to the divot 34 (FIG. 3).

The gate cap 36 is formed to protect the gate conductor 30 when exposed to an etchant during a contact opening etch process in subsequent steps. However, the thickness of the gate cap 36 is in many cases inadequate to provide enough protection for the contact opening etch.

Figure 5:
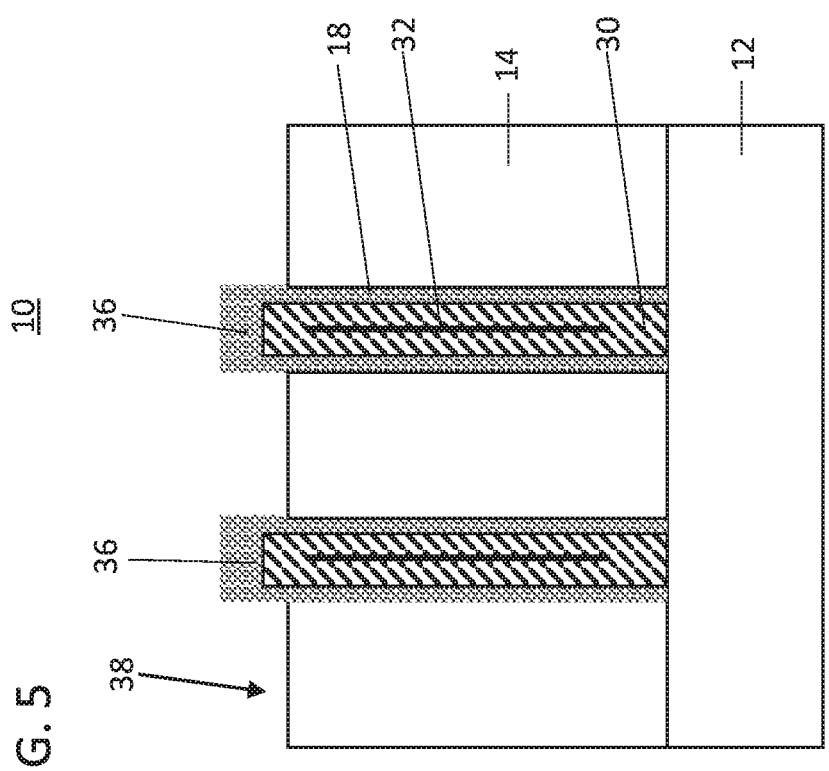
FIG. 5 is a cross-sectional view showing the semiconductor device of FIG. 4 having a dielectric fill recessed to expose the gate cap formed in the divot over the gate conductors in accordance with the present principles.

Referring to FIG. 5, the dielectric fill 14 may be employed for shallow trench isolation (STI) in some regions of the device 10. The dielectric fill 14 is subjected to a recess etch process. The recess etch may include a reactive ion etch. The recess etch reduces a height of the dielectric fill 14 to below the top portion of the gate cap 36. The recess etch may continue to further increase a recess depth of the dielectric fill 14 to below the gate cap 36 and beyond. The depth of a recess 38 formed in the dielectric fill 14 depends on an amount of extra thickness needed over and above the thickness of the gate cap 36 to provide sufficient protection of the gate conductor 30 during the contact opening etch.

Figure 6:
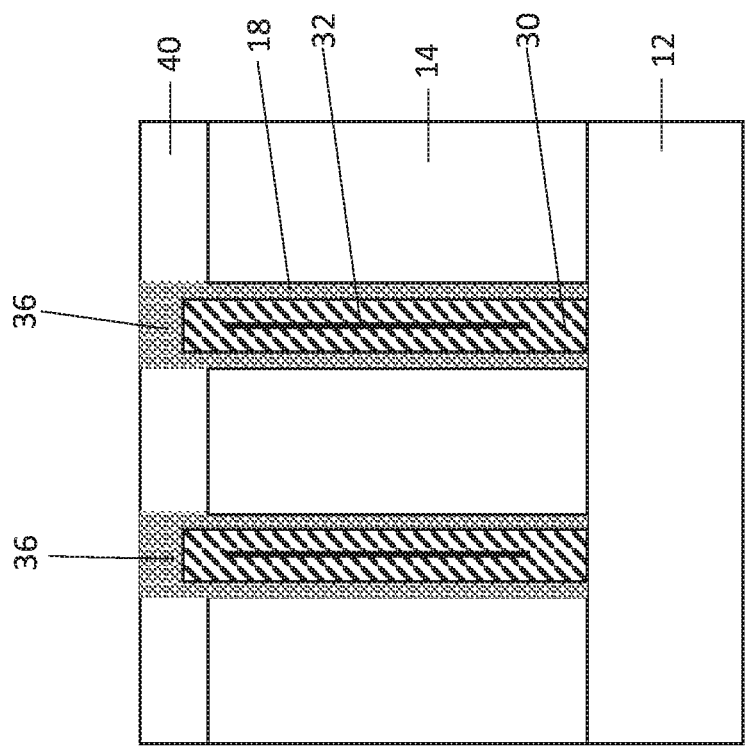
FIG. 6 is a cross-sectional view showing the semiconductor device of FIG. 5 having an extension layer formed over the recessed dielectric fill and planarized to a top of the gate cap over the gate conductors in accordance with the present principles.

Referring to FIG. 6, an extension layer 40 is deposited over the gate caps 36. Excess material is removed by planarizing the extension layer 40, e.g., by an etch or a CMP process. The planarizing process stops on the gate caps 36 and exposes the gate caps 36. The extension layer 40 may include a dielectric or semiconductor material. In particularly useful embodiment, the extension layer 40 includes polysilicon.

Figure 7:
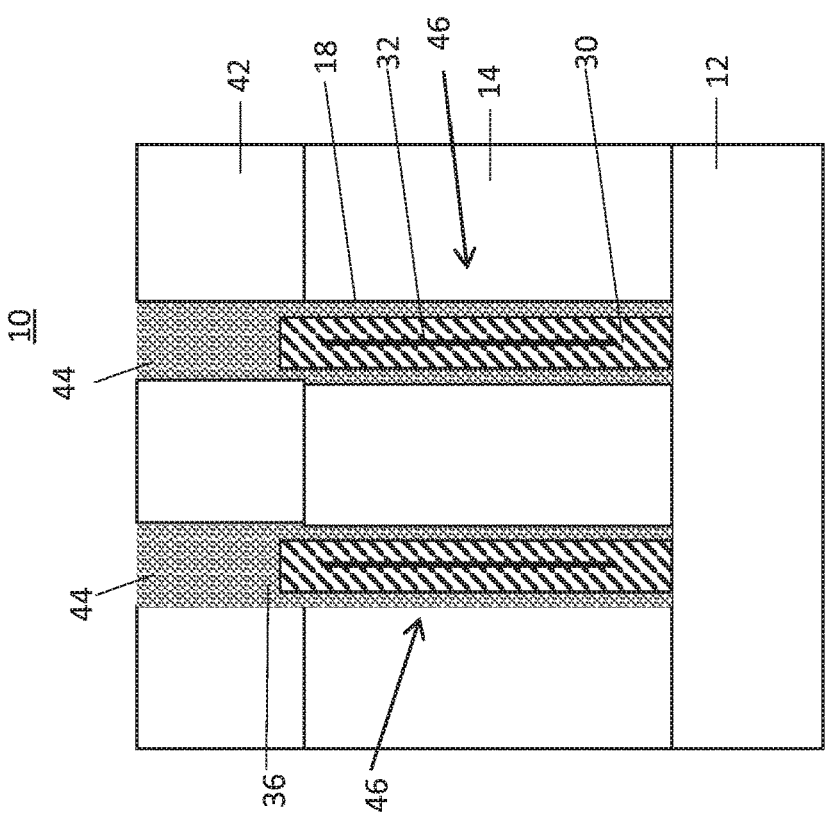
FIG. 7 is a cross-sectional view showing the semiconductor device of FIG. 6 having a profile growth layer formed from the extension layer and having second divots formed therein over the gate cap in accordance with the present principles.

Referring to FIG. 7, the extension layer 40 includes a material that can be expanded while maintaining exposed gate caps 36. In one embodiment, the extension layer 40 includes polysilicon, which can be exposed to an oxidation process. The oxidation expands the height of the extension layer 40 to form a profile growth layer 42 (e.g., an oxide, such as silicon oxide) over S/D regions adjacent to gate structures 46. Oxidation may expand polysilicon volume by between 50% to 125% and more particularly by about 100%. This can be controlled by the type of oxidation process selected and the parameters employed, for example, the temperature and oxygen concentration employed. In one embodiment, the oxidation process may include an anneal (e.g., temperatures between about 500 C to about 1200 C) in an oxygen or oxygen plasma environment. Other temperatures, durations and chemistries may also be employed.

The profile growth layer 24 may constrict a bit into divots 48 formed by the expansion of the polysilicon. The constriction narrows the divots 48 on top of gate structures 46. An etch back of the profile growth layer 42 can enlarge the divot 48 on top of gate structures to create a structure that is wider than the gate cap 36 and may be tapered or include a tapered profile (e.g., being larger at the top of the divot 48 than at a point closest to the gate cap 36). In one embodiment, the divots 48 may be enlarged by an isotropic etch, if needed.

Figure 8:
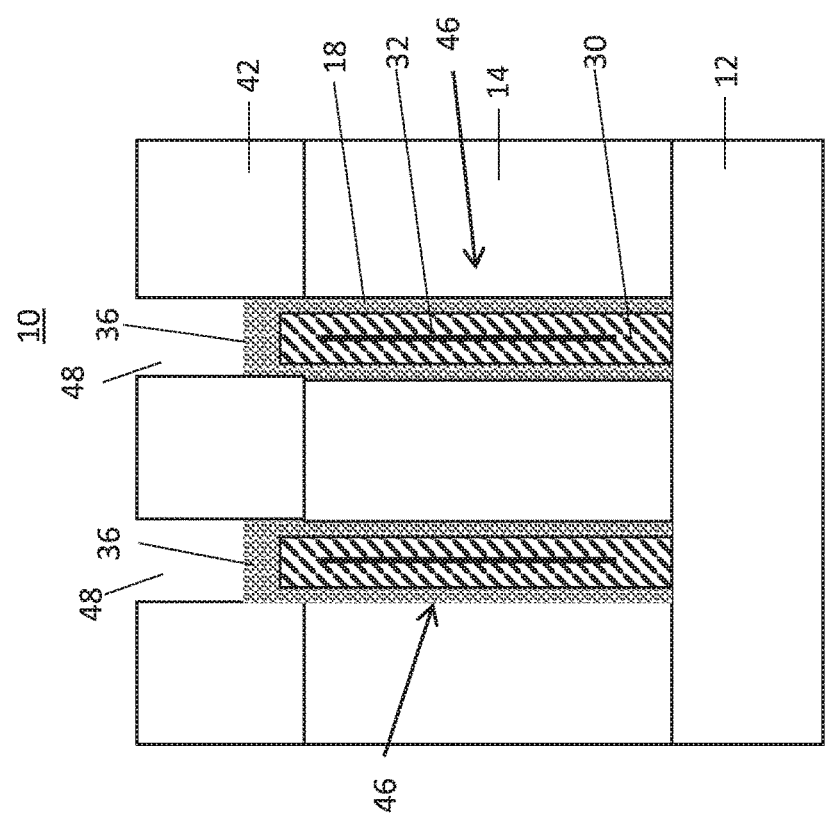
FIG. 8 is a cross-sectional view showing the semiconductor device of FIG. 7 having a top cap formed within the profile growth layer on the gate cap in accordance with the present principles.

Referring to FIG. 8, a top cap 44 is formed on the gate cap 36. The top cap 44 may include a nitride, such as SiN or other dielectric materials, e.g., an oxide, an oxynitride, etc. The gate cap 36 and the top cap 44 may include a different or same dielectric materials. In one embodiment, the top cap 44 may include SiBCN, while the gate cap 36 may include SiN. Other material combinations are also contemplated.

In one embodiment, the top cap 44 is formed by depositing dielectric material to fill in the divots 48 (FIG. 7) and then a top surface of the device 10 is planarized, e.g., by CMP or an etch, to confine the top cap 44 to the divot 48 (FIG. 7). The top cap 44 is formed to further protect the gate conductor 30 when exposed to an etchant during a contact opening etch process. The thickness of the profile growth layer 42 provides additional thickness to the SAC cap (which includes gate cap 36 and top cap 44) to provide enough protection for the contact opening etch.

While the present principles have been described in terms of a gate conductor, the same or similar processes may be employed for the formation of contacts or vias connected between layers in semiconductor devices to avoid interfacing with seams in metal structures. Processing can continue with an interlevel dielectric layer being formed and planarized, and contacts, metallizations, etc. being formed.

Figure 9:
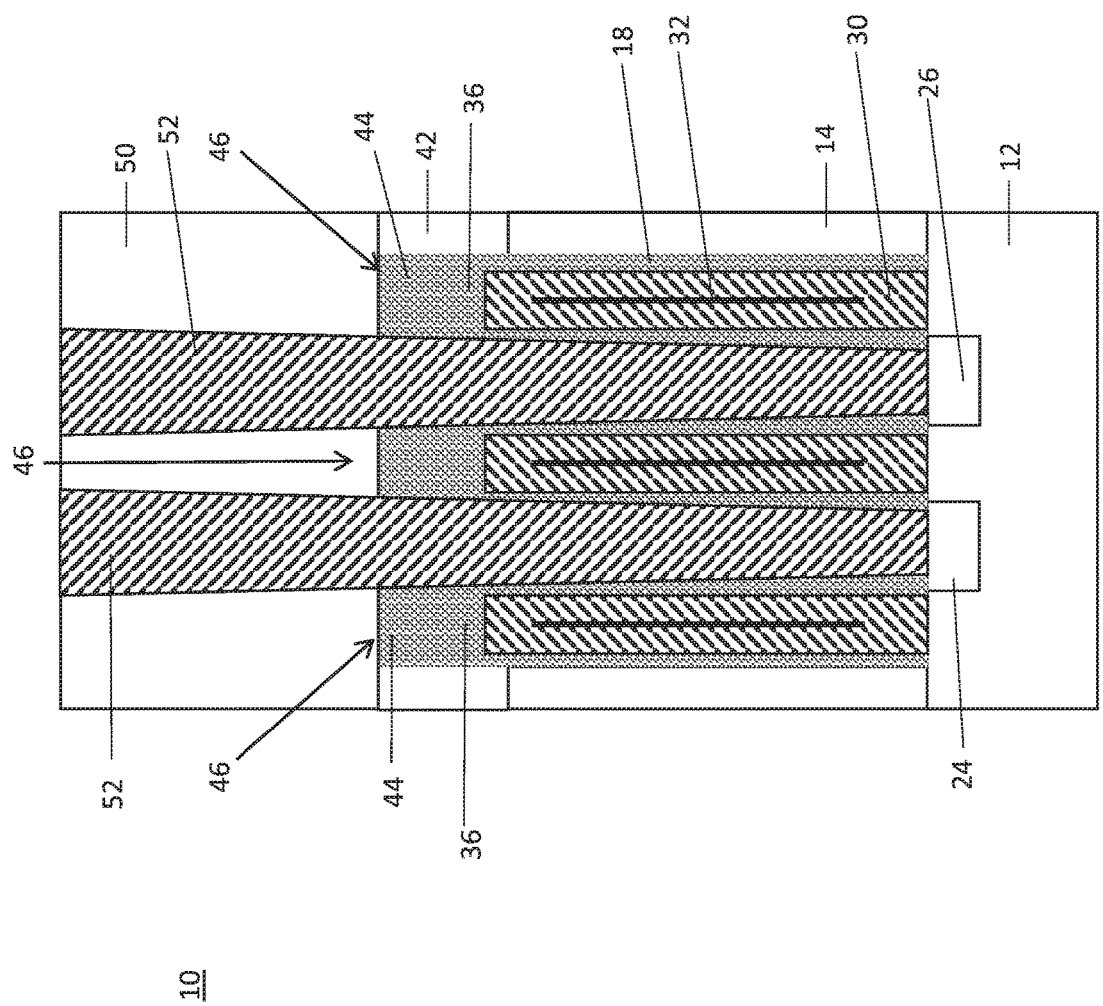
FIG. 9 is a cross-sectional view showing the semiconductor device of FIG. 8 having self-aligned contacts formed between the gate structures in accordance with the present principles.

Referring to FIG. 9, an interlevel dielectric (ILD) layer 50 is formed. The ILD layer 50 may include an oxide or other suitable dielectric material. The ILD layer 50 is patterned using lithography or other patterning techniques and etched, e.g., using a RIE to form contact holes. The gate structures 46 are protected by the caps (44, 36) during the etch process. The extra thickness of the cap (44, 36) provides protection for the extended etch process for the contact holes to reach the S/D region 24, 26 in the substrate 12.

A conductive material is deposited and planarized to form self-aligned contacts (SAC) 52 (self-aligned between the gate structures 46). The conductive material for the contacts 52 may be deposited using CVD, sputtering, or any other suitable method.

The contacts 52 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

Figure 10:
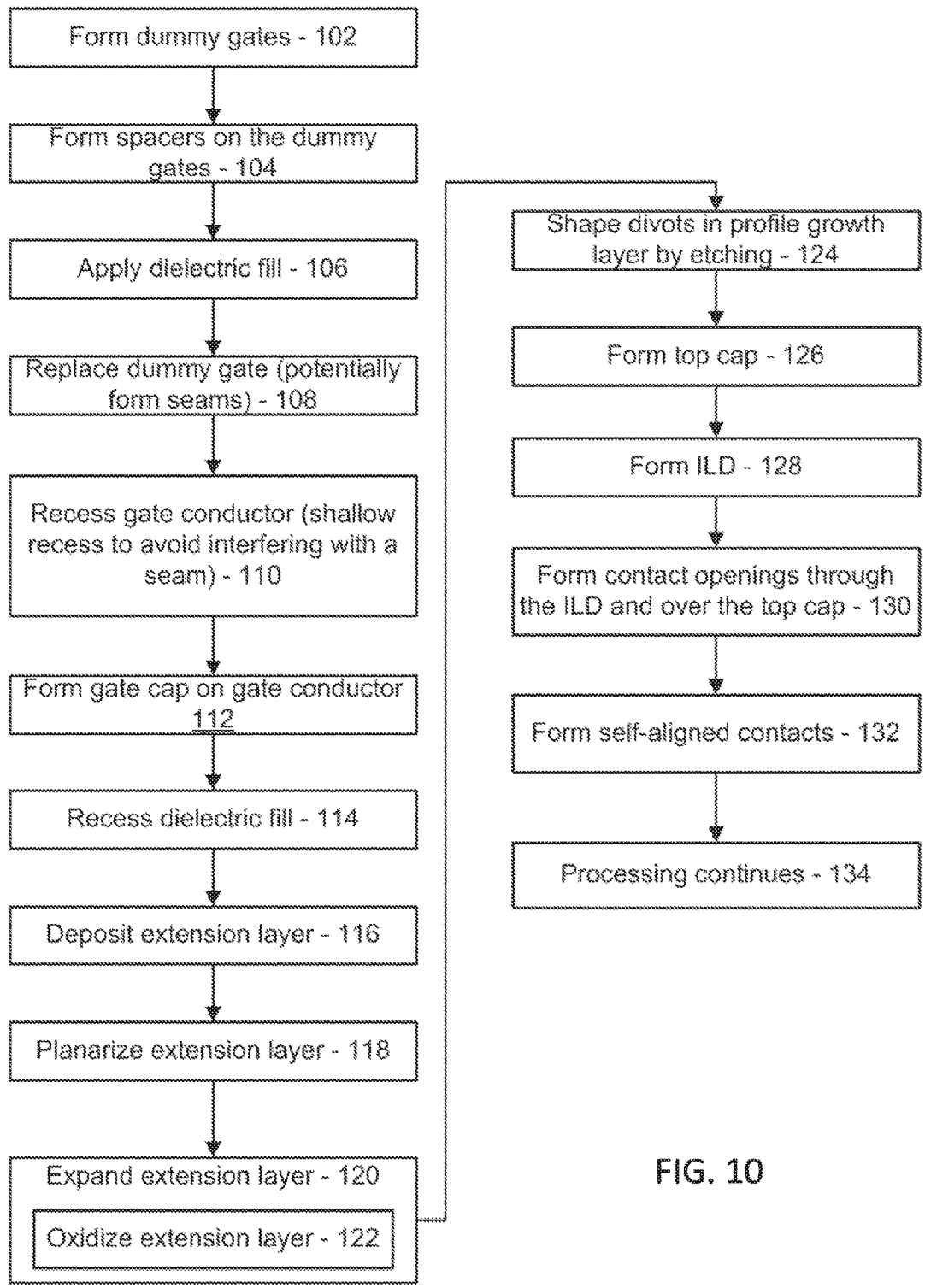
FIG. 10 is a block/flow diagram showing methods for forming a semiconductor device in accordance with the present principles.

Referring to FIG. 10, methods for forming a semiconductor device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a dummy gate is formed (patterned) on a semiconductor substrate or on semiconductor fins. In block 104, spacers are formed on sidewalls of the dummy gate to form gate structures. In block 106, a dielectric fill fills between the gate structures. The dielectric fill may also be employed to form shallow trench isolation (STI) regions. In block 108, the dummy gate is replaced with a replacement gate having a gate conductor formed by deposition. A seam or seams can potentially be formed during gate conductor formation. In a gate first process, the dummy gate is not employed. The gate conductor is formed instead of the dummy gate, and processing continues without the removal and replacement of the dummy gate.

In block 110, the gate conductor is recessed in the gate structure to form a first divot that is shallow enough not to interfere with the potential seam formed during gate conductor formation. In block 112, a gate cap is formed in the first divot. In block 114, a dielectric fill that encapsulates the gate structures to a position below a top of the gate cap is recessed. In block 116, an extension layer is deposited over the dielectric fill and the top of the gate cap. The extension layer may include a polysilicon layer. In block 118, the extension layer is planarized to the top of the gate cap.

In block 120, the extension layer is expanded to form a profile growth layer that is thicker than the extension layer and creates a second divot over the gate cap. In one embodiment, the extension layer is expanded by oxidation, in block 122, to form the profile growth layer with second divots formed therein. In block 124, the profile growth layer may be isotropically etched to shape the second divots.

In block 126, a top cap is formed in the second divot to provide a cap with a thickness of the gate cap and the top cap. In block 128, an interlevel dielectric (ILD) layer is formed over the gate structure. In block 130, self-aligned contact openings are formed through the (ILD) with the top cap exposed to the etching. In block 132, self-aligned contacts are formed in the contact openings. In block 134, processing continues to complete the device.

Having described preferred embodiments for a self-aligned contact cap (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    recessing a dielectric fill that encapsulates a gate structure to a position below a top of a gate cap formed in a first divot;
    depositing an extension layer over the dielectric fill and the top of the gate cap;
    planarizing the extension layer to the top of the gate cap; and
    expanding the extension layer to form a profile growth layer that is thicker than the extension layer and to create a second divot extending to a top surface of the gate cap.

2. The method as recited in claim 1, wherein the first divot is formed by recessing a gate conductor in the gate structure without interfacing with a seam formed within the gate conductor.

3. The method as recited in claim 1, wherein depositing the extension layer includes depositing a polysilicon layer.

4. The method as recited in claim 3, wherein expanding the extension layer includes oxidizing the polysilicon layer to form the profile growth layer having second divots formed therein.

5. The method as recited in claim 4, further comprising isotropically etching the profile growth layer to shape the second divots.

6. The method as recited in claim 1, wherein expanding the extension layer includes expanding the extension layer by about 100% in thickness.

7. A method for forming a semiconductor device, comprising:
    replacing a dummy gate of a gate structure with a replacement gate having a gate conductor formed by deposition;
    recessing the gate conductor in the gate structure to form a first divot that is shallow enough not to interfere with a potential seam formed during gate conductor formation;
    recessing a dielectric fill that encapsulates the gate structure to a position below a top of a gate cap formed in the first divot;
    depositing an extension layer over the dielectric fill and the top of the gate cap;
    planarizing the extension layer to the top of the gate cap; and
    expanding the extension layer to form a profile growth layer that is thicker than the extension layer and to create a second divot extending to a top surface of the gate cap.

8. The method as recited in claim 7, wherein depositing the extension layer includes depositing a polysilicon layer.

9. The method as recited in claim 8, wherein expanding the extension layer includes oxidizing the polysilicon layer to form the profile growth layer having second divots formed therein.

10. The method as recited in claim 9, further comprising isotropically etching the profile growth layer to shape the second divots.

11. The method as recited in claim 8, wherein expanding the extension layer includes expanding the extension layer by about 100% in thickness.

* * * * *